United States Patent
Weaver

(10) Patent No.: US 7,147,424 B2
(45) Date of Patent: Dec. 12, 2006

(54) AUTOMATIC DOOR OPENER

(75) Inventor: William Tyler Weaver, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 144 days.

(21) Appl. No.: 10/070,330

(22) PCT Filed: Jun. 30, 2001

(86) PCT No.: PCT/US01/41237

§ 371 (c)(1),
(2), (4) Date: Mar. 5, 2002

(87) PCT Pub. No.: WO02/04774

PCT Pub. Date: Jan. 17, 2002

(65) Prior Publication Data

US 2004/0211701 A1 Oct. 28, 2004

Related U.S. Application Data

(60) Provisional application No. 60/217,147, filed on Jul. 7, 2000.

(51) Int. Cl.
B66C 1/00 (2006.01)
H01L 21/67 (2006.01)
(52) U.S. Cl. .............. 414/684.3; 414/217; 414/225.01; 414/744.1; 414/917; 414/738
(58) Field of Classification Search ................ 414/217, 414/416, 937, 935, 939, 609, 684, 744.3, 414/627, 225.01, 917, 411, 673, 732, 733, 414/738; 29/700, 705
See application file for complete search history.

(56) References Cited

U.S. PATENT DOCUMENTS

| | | | | |
|---|---|---|---|---|
| 3,883,105 A | * | 5/1975 | Matsumoto | 248/281.11 |
| 6,010,299 A | * | 1/2000 | Jesswein | 414/917 |
| 6,042,324 A | | 3/2000 | Aggarwal et al. | |
| 6,053,688 A | | 4/2000 | Cheng | |
| 6,079,935 A | * | 6/2000 | Brunner et al. | 414/917 |
| 6,086,312 A | * | 7/2000 | Ziaylek et al. | |
| 6,454,508 B1 | | 9/2002 | Toshima et al. | |
| 6,641,350 B1 | * | 11/2003 | Nakashima et al. | 414/217 |
| 2001/0048866 A1 | * | 12/2001 | Sakiya et al. | 414/217 |
| 2002/0044859 A1 | * | 4/2002 | Lee et al. | 414/411 |
| 2005/0111943 A1 | * | 5/2005 | Otaguro | 414/411 |

FOREIGN PATENT DOCUMENTS

EP 0 959 495 A1 11/1999

* cited by examiner

Primary Examiner—Gene O. Crawford
Assistant Examiner—Mark A. Deuble
(74) Attorney, Agent, or Firm—Dugan & Dugan

(57) ABSTRACT

A wafer carrier opener is provided. The wafer carrier opener may eliminate the use of two separate actuators by using a four-bar linkage mechanism. The wafer carrier opener includes a wafer carrier door receiver, a horizontally stationary member, and a link coupled between the wafer carrier door receiver and the horizontally stationary member so as to allow horizontal movement of the wafer carrier door receiver.

10 Claims, 7 Drawing Sheets

AUTOMATIC DOOR OPENER

This application claims priority from U.S. Provisional Patent Application Ser. No. 60/217,147, filed Jul. 7, 2000, which is hereby incorporated by reference herein in its entirety.

FIELD OF THE INVENTION

The invention relates generally to fabrication systems and more particularly to an apparatus and method for opening a door portion of a wafer carrier.

BACKGROUND OF THE INVENTION

Conventional semiconductor fabrication systems transport a plurality of wafers in a sealed wafer carrier such as a sealed container or pod, thereby maintaining the wafers in a clean/controlled environment. Thus, conventional processing systems include a plurality of wafer carrier loading stations where the sealed pods are opened, wafers are extracted therefrom and are loaded into the processing system. Each wafer carrier loading station comprises a wafer carrier platform adapted to receive a sealed pod, which contains a cassette of wafers, and a wafer carrier opener adapted to engage and unlatch a door portion of the pod (hereinafter a pod door).

In operation, the wafer carrier platform receives a pod and moves the pod horizontally toward the wafer carrier opener. Thereafter, the wafer carrier opener engages and unlatches the pod door. A first actuator moves the pod door horizontally away from the wafer carrier platform, and then a second actuator moves the pod door vertically downward to provide clear access to the wafers in the pod. Hence, the wafer carrier opener requires the use of two separate actuators, which increases equipment expense.

Accordingly, there is a need for an improved wafer carrier opener having a pod door that moves both vertically and horizontally while using only a single actuator, thus satisfying the ever-present demand for reduced cost per unit wafer processed.

SUMMARY OF THE INVENTION

The inventive wafer carrier opener may eliminate the use of two separate actuators by using a linkage mechanism. The inventive wafer carrier opener comprises a wafer carrier door receiver, adapted to receive a wafer carrier door, a horizontally stationary member, and a link coupled between the wafer carrier door receiver and the horizontally stationary member so as to allow horizontal movement of the wafer carrier door receiver.

A method of opening a sealed wafer carrier, the method comprising: elevating a wafer carrier door receiver assembly; impacting a vertical motion stop with a portion of the wafer carrier door receiver assembly thereby limiting the vertical motion of a portion of the wafer carrier door receiver assembly; continuing elevating a remaining portion of the wafer carrier door receiver assembly; and translating the continued elevation of the remaining portion of the wafer carrier door receiver assembly into horizontal motion of at least a door receiving portion of the vertically limited portion of the wafer carrier door receiver assembly.

Other features and advantages of the present invention will become more fully apparent from the following detailed description of the preferred embodiments, the appended claims and the accompanying drawings.

BRIEF DESCRIPTION OF THE PREFERRED EMBODIMENTS

Figure 3A:
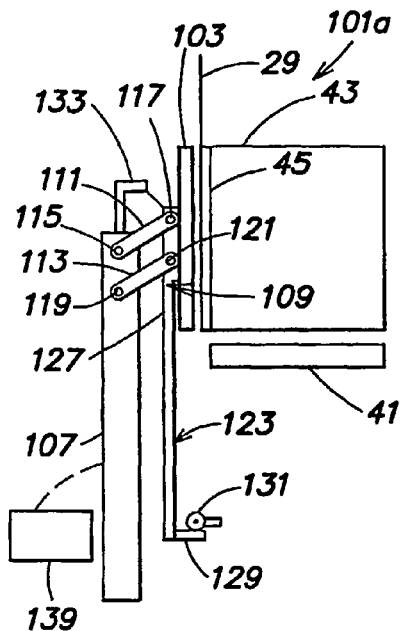
Figure 3B:
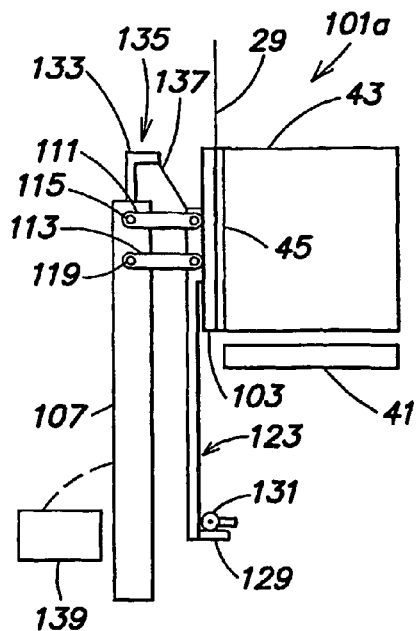
Figure 3C:
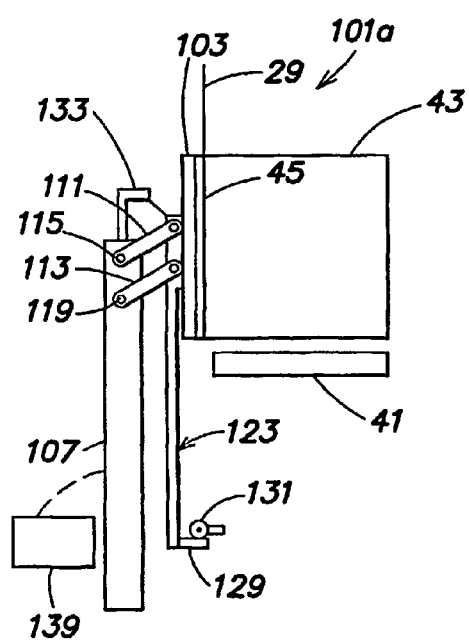
Figure 3D:
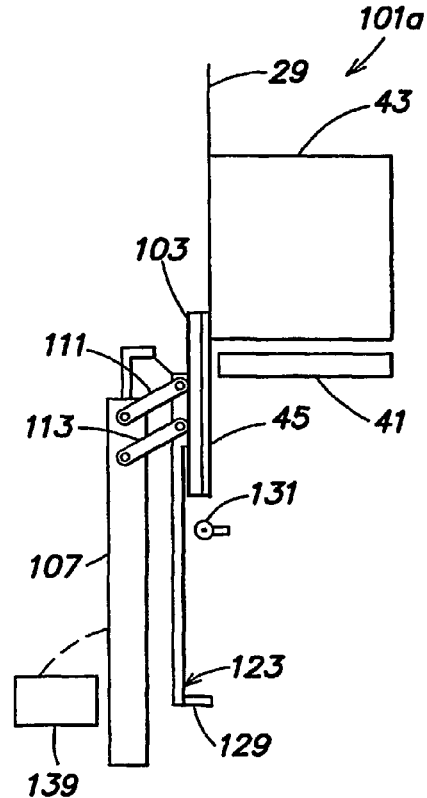
Figure 4:
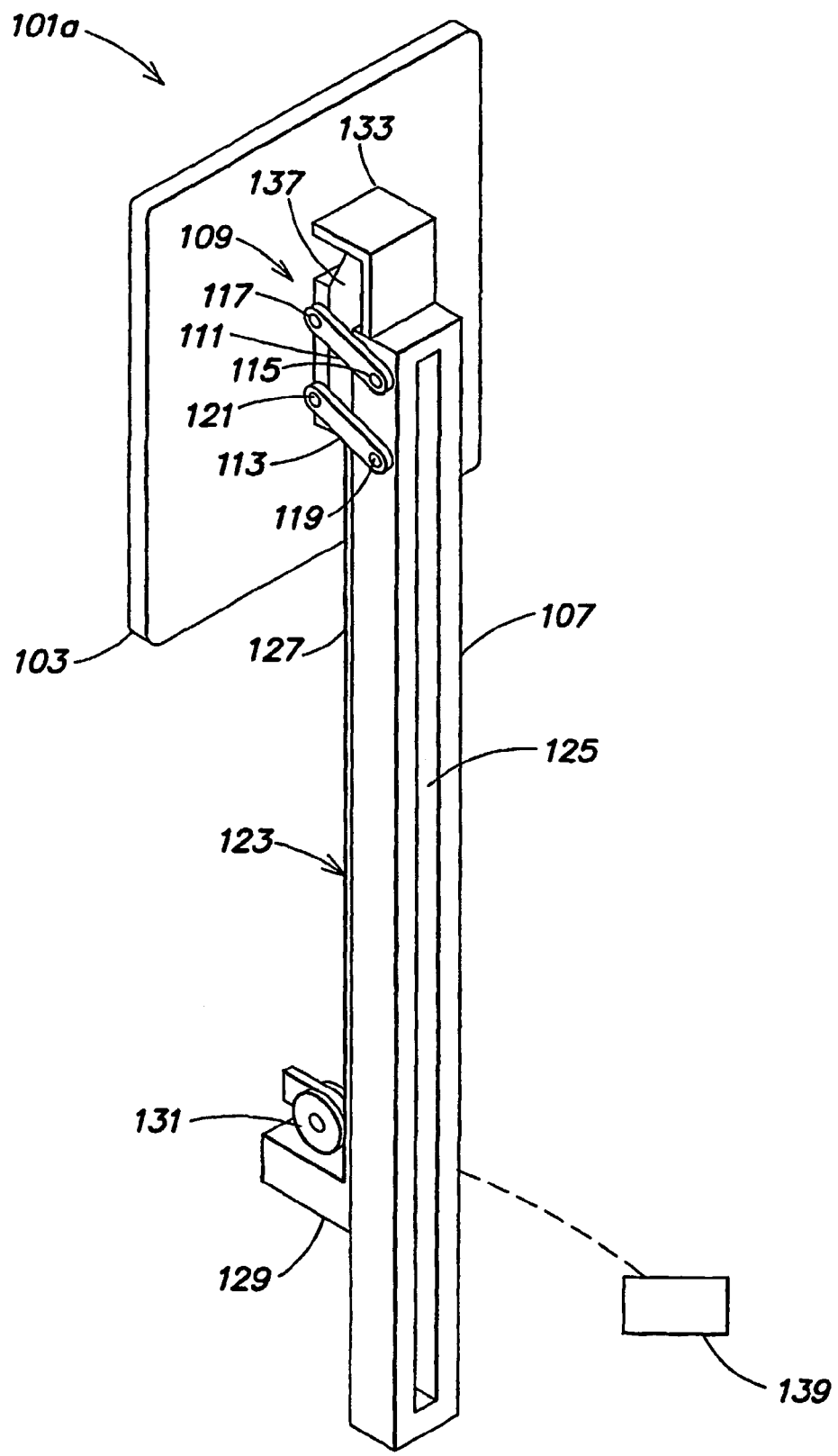
Figure 5:
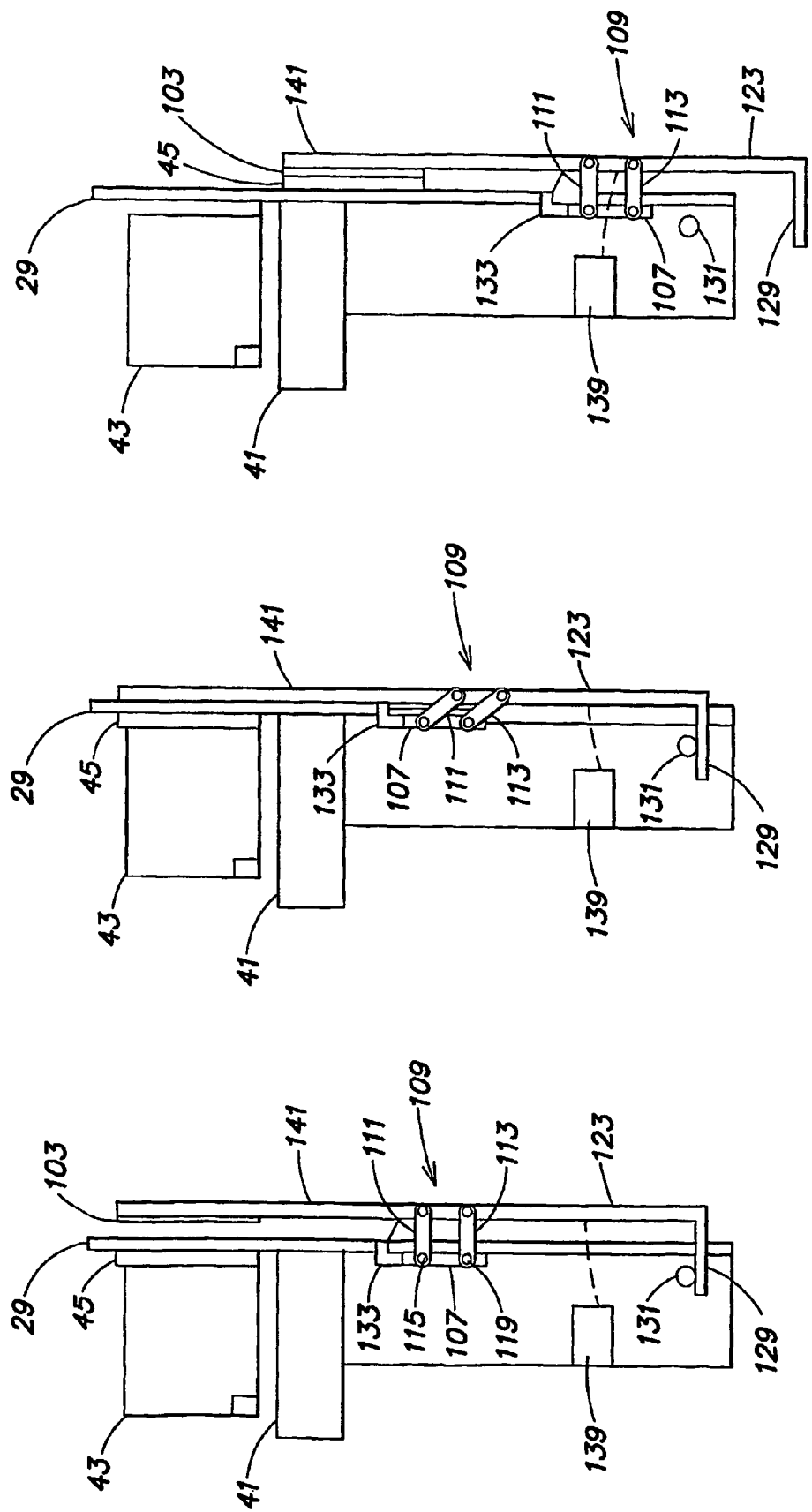
Figure 6:
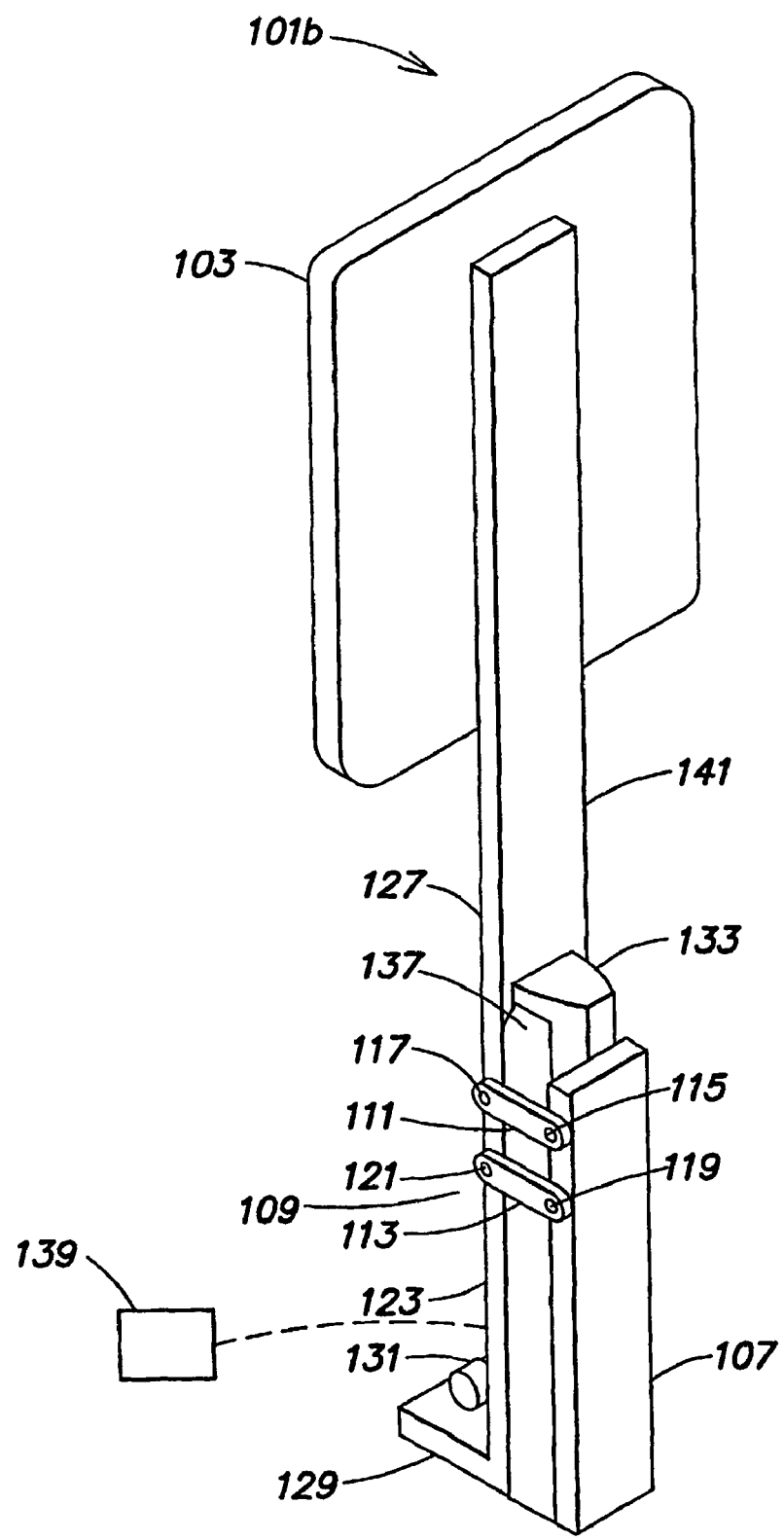

FIGS. 3A–D are sequential side views of a first embodiment of an inventive wafer carrier opener;

FIG. 4 is a perspective side view of the inventive wafer carrier opener of FIGS. 3A–D;

FIGS. 5A–C are side views of a second embodiment of the inventive wafer carrier opener; and FIG. 6 is a perspective side view of the second embodiment of the inventive wafer carrier opener with a horizontally stationary member in an alternative position.

DETAILED DESCRIPTION OF THE PREFERRED EMBODIMENT

Figure 1:
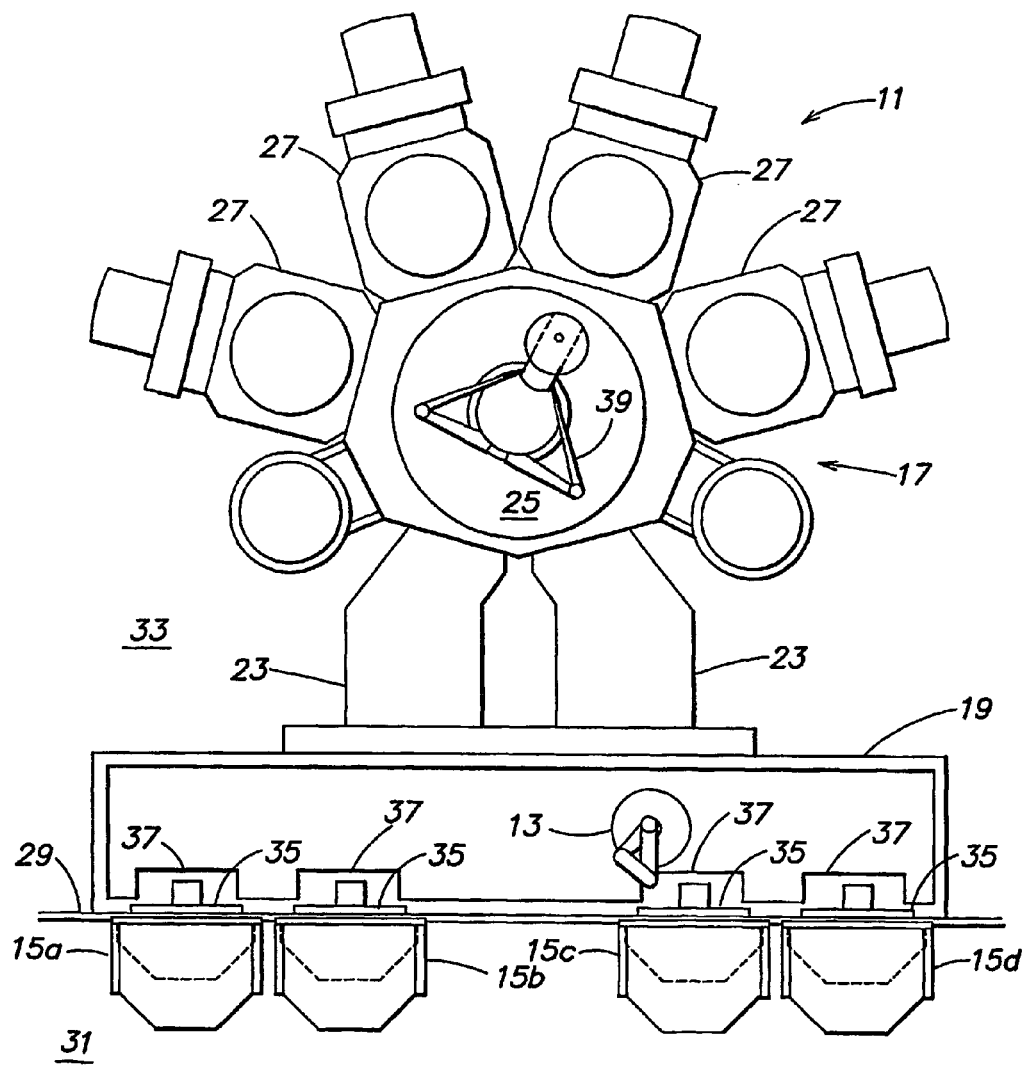
FIG. 1 is a schematic top plan view, in pertinent part, of a processing system having a factory interface wafer handler adapted to transport wafers between a plurality of wafer carrier loading stations and a processing tool.

FIG. 1 is a schematic top plan view, in pertinent part, of a processing system 11 having a factory interface wafer handler 13 adapted to transport wafers between a plurality of wafer carrier loading stations 15a–d and a processing tool 17. The exemplary processing system 11 shown in FIG. 1 includes an interface chamber 19 and the processing tool 17 which, in this example, comprises a pair of loadlock chambers 23, a transfer chamber 25 coupled to the loadlock chambers 23, and a plurality of processing chambers 27 coupled to the transfer chamber 25.

An interface wall 29 is positioned between the wafer carrier loading stations 15a–d and the processing system 11 for separating a "white area," clean room 31 from a less clean; "gray area" clean room 33. The wafer-carrier loading stations 15a–d are located in the "white area" clean room 31 and the processing system 11 is located in the less clean, "gray area" clean room 33. The wafer carrier loading stations 15a–d are positioned adjacent sealable openings 35 in the interface wall 29. The wafer carrier loading stations 15a–d comprise a wafer carrier platform (not shown) adapted to receive a sealed pod (not shown) and a conventional wafer carrier opener 37 adapted to engage and unlatched a pod door from the remainder of the pod as is known in the art.

The interface chamber 19 contains the interface wafer handler 13 mounted to a track T (not shown). The transfer chamber 25 of the processing tool 17 contains a transfer wafer handler 39 adapted to transport wafers (not shown) between the loadlock chambers 23 and the processing chambers 27.

In operation, a pod, containing cassettes of wafers, is loaded onto the wafer carrier loading station 15. The conventional wafer carrier opener 37 engages and unlatches the pod door. With the use of two separate actuators (not shown), the conventional wafer carrier opener 37 moves the pod door horizontally away from the wafer carrier platform and then moves the pod door vertically downward to provide clear access to the wafers in the pod. The interface wafer handler 13 of the interface chamber 19 then extracts a wafer from the pod and transports the wafer to one of the loadlock chambers 23. Thereafter, the transfer wafer handler 39 of the processing tool 17 transports the wafer from the loadlock chamber 23 to a processing chamber 27, wherein a processing step is performed on the wafer.

Figure 2A:
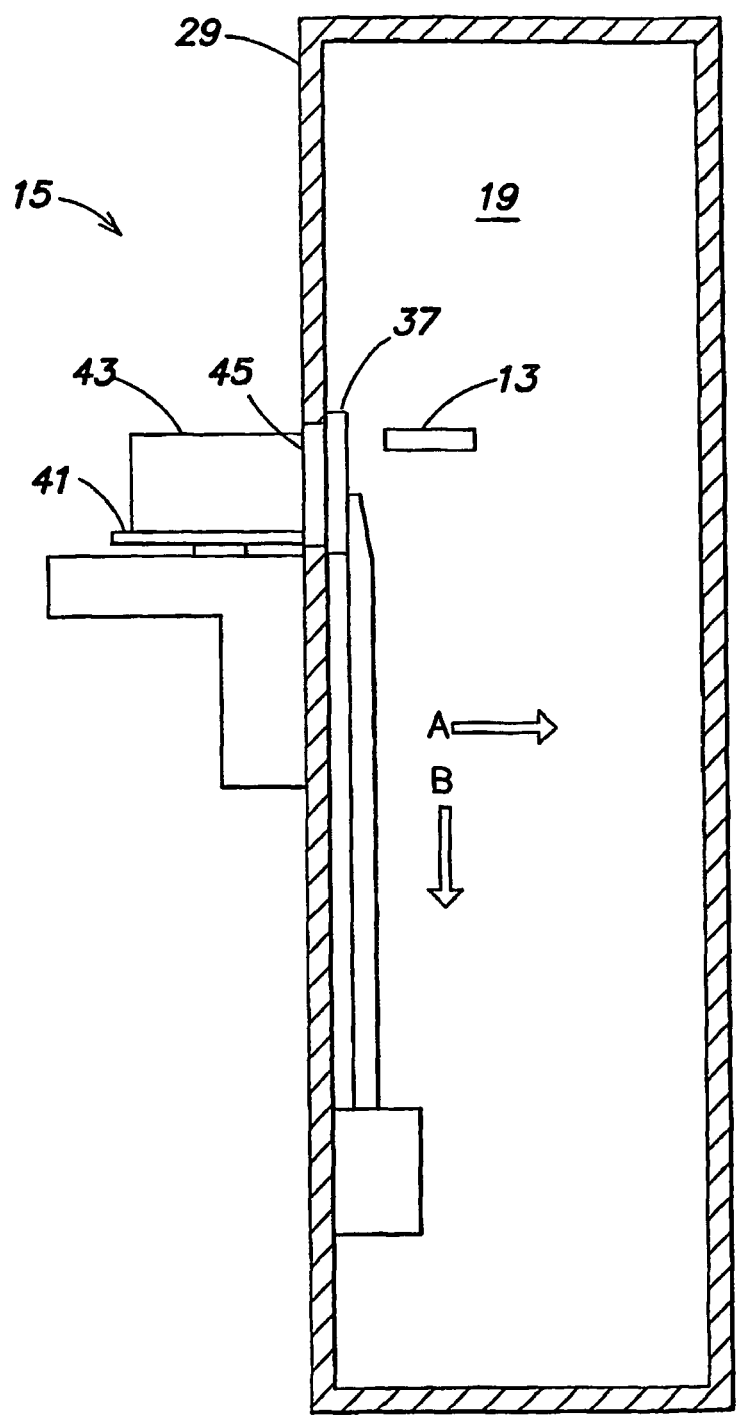
FIG. 2A is a schematic side view of the wafer carrier loading station of FIG. 1, having the conventional wafer carrier opener.

FIG. 2A is a schematic side view of the wafer carrier loading station 15 of FIG. 1, having the conventional wafer carrier opener 37. As previously stated, the wafer carrier loading station 15 comprises a wafer carrier platform 41 adapted to receive a pod 43 and the conventional wafer carrier opener 37 adapted to engage and unlatched a pod door 45 as is known in the art.

Figure 2B:
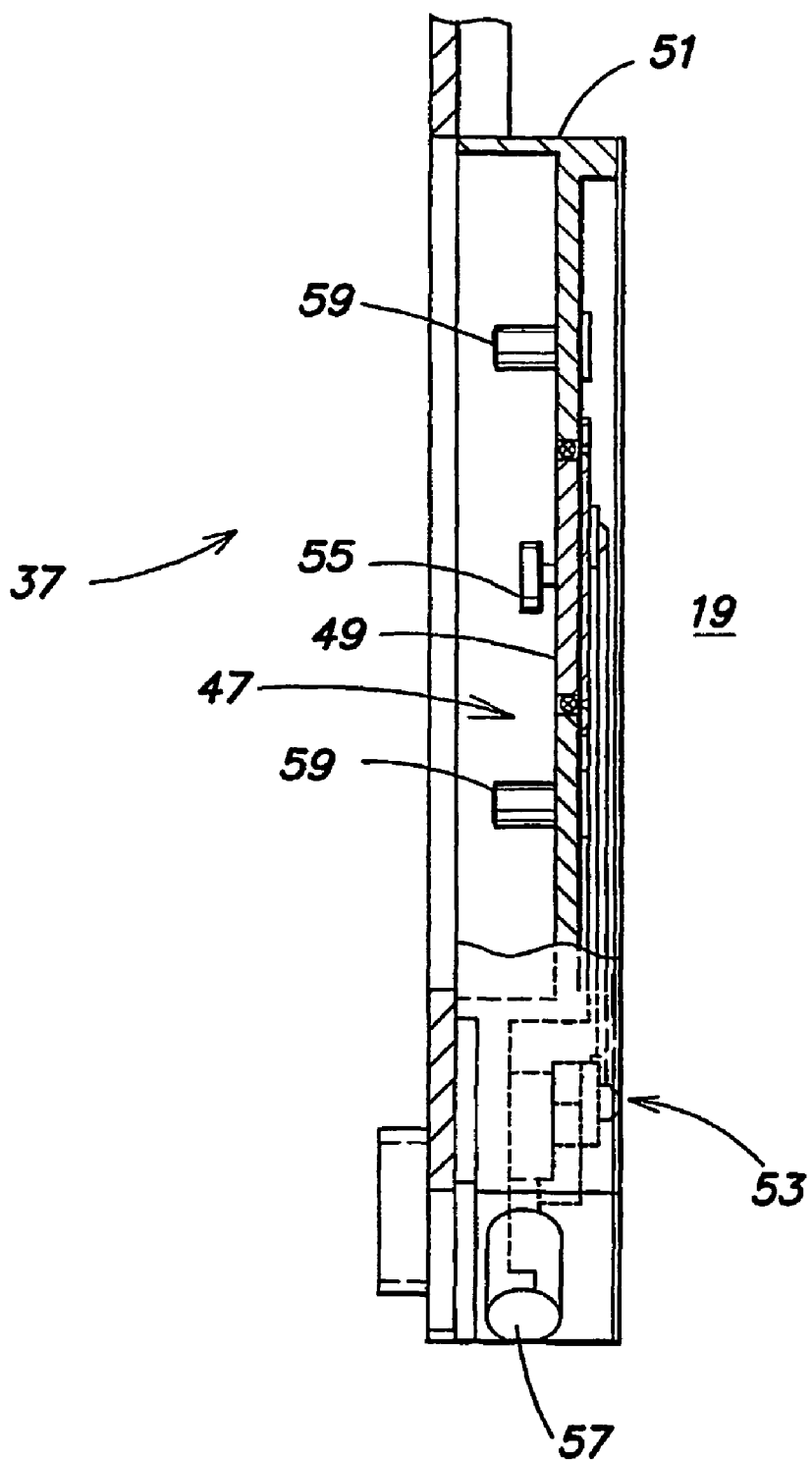
FIG. 2B is a side cross-sectional view of the conventional wafer carrier opener of FIG. 2A.

FIG. 2B is a side cross-sectional view of the conventional wafer carrier opener 37 of FIG. 2A. The conventional wafer carrier opener 37 defines a recess 47 into which a pod door 45 (shown in FIG. 2A) is received. The recess 47 is defined by a plate 49 and a wall 51. The is plate 49 of the recess 47 includes a pod door key actuating mechanism 53, which is connected to a key 55 and to an actuator 57 adapted to unlatch the pod door 45 from the remainder of the pod 43. Alignment pins 59 are also provided on the plate 49 for aligning the pod door 45 with the conventional wafer carrier opener 37 such that the pod door receiver key 55 enters a corresponding key hole (not shown) on the pod door 45.

In operation, the wafer carrier platform 41 moves in a horizontal plane to receive the pod 43 in a position away from the interface wall 29. The wafer carrier platform 41 then moves the pod 43 into a position adjacent the interface wall 29. In this position the pod door 45 is positioned within the recess 47 of the conventional wafer carrier opener 37.

The alignment pins 59 on the conventional wafer carrier opener 37 ensure proper alignment of the pod door 45 such that the key 55 positioned on the conventional wafer carrier opener 37 engages the pod door lock (not shown).

The actuator 57 then activates the pod door key actuating mechanism 53, which in turn rotates the key 55 to unlatch the pod door latches (not shown). Once the pod door latches are unlatched, the pod door 45 is unlocked from the remainder of the pod 43.

Thereafter, the conventional wafer carrier opener 37 having the pod door 45 now attached thereto moves the pod door 45 horizontally, via a horizontal actuator (e.g., a first actuator not shown), in a direction away from the wafer carrier platform 41, as indicated by arrow A. A vertical actuator (e.g. a second actuator not shown) then moves the pod door 45 vertically downward, as indicated by arrow B, until the pod door 45 clears the opening in the interface wall 29 to provide access to the-wafers or is cassette in tie pod 43 by a wafer handler 13 within the interface chamber 19. As described above, the conventional wafer carrier opener 37 requires the use of two separate actuators in order to open and/or close a sealed wafer carrier.

Accordingly, the present inventor has provided an improved wafer carrier opener that employs a single actuator to achieve both the vertical and horizontal pod door movement.

The components of a first embodiment of an inventive wafer carrier opener 101a are described with reference to FIGS. 3A–4. FIGS. 3A–D are sequential side views of the inventive wafer carrier opener 101a, and FIG. 4 is a perspective side view of the inventive wafer carrier opener 101a. Except for the two actuators (a horizontal actuator, and a vertical actuator) the inventive wafer carrier opener 101a may comprise the same components as the conventional wafer carrier opener 37 of FIG. 2B. The conventional components of the inventive wafer carrier opener 101a are therefore not further described with reference to FIGS. 3A–4. In addition to the conventional components, the inventive wafer carrier opener 111a of FIGS. 3A–4 comprises a horizontally stationary member 107 (e.g., a member fixed against horizontal motion via a track which allows vertical motion of the horizontally stationary member 107 but which prohibits horizontal motion), and a link 109 coupled between a wafer carrier door receiver 103 and the horizontally stationary member 107, so as to allow vertical actuation to be translated into horizontal movement of the wafer carrier door receiver 103, as described below.

The link 109 may comprise an upper link 111 and a lower link 113, both adapted to pivot between a retracted position and an extended position. The upper link 111 comprises a first joint 115 and a second joint 117. The first joint 115 is coupled to the horizontally stationary member 107 and the second joint 117 is coupled to the wafer carrier door receiver 103. Similarly, the lower link 113 comprises a first joint 119 and a second joint 121, which also are coupled to the horizontally stationary member 107 and the wafer carrier door receiver 103, respectively.

Thus, the wafer carrier door receiver 13, the horizontally stationary member 107, the upper link 111, and the lower link 113 may be configured to comprise what is conventionally known as a four-bar link.

The inventive wafer carrier opener 111a further comprises a mechanism (e.g., a cam follower 123) that may be coupled to the horizontally, stationary member 107 so as to move vertically therewith, and such that the horizontally stationary member 107 also may move vertically relative to the cam follower 123. In one aspect, the cam follower 123 may be positioned in a slot 125 (FIG. 4) of the horizontally stationary member 107 as shown in FIG. 4. Also as shown in FIG. 4, an additional link 109 may be included if desired.

The cam follower 123 comprises a vertical extension 127 and a horizontal extension 129. The vertical extension 127 of the cam follower 123 is coupled to the wafer carrier door receiver 103, (in this example via the second joint 121 of the lower link 113), so that the cam follower 123 moves horizontally with the wafer carrier door receiver 103. The horizontal extension 129 is adapted so as to contact a vertical motion stop (e.g., a cam 131) as the inventive wafer carrier opener 101a moves vertically upward, thereby stopping further vertical motion of the cam follower 123.

The cam 131 is positioned adjacent the cam follower 123 and between the horizontal extension 129 and the wafer carrier door receiver 103 as shown in FIGS. 3A–C. Specifically, the cam 131 is positioned such that when the horizontal extension 129 of the cam follower 123 contacts the cam 131, the wafer carrier door receiver 103 is in position to engage (e.g., at the same elevation as) the pod door 45, located on the wafer carrier platform 41. Hence, the cam 131 and the wafer carrier platform 41 may serve as datum points to provide accurate alignment of the inventive wafer carrier opener 111a so as to properly position the wafer carrier door receiver 103 relative to the pod door 45.

The inventive wafer carrier opener 101a may also include a counterbalancing mechanism adapted to bias the wafer carrier door receiver 103 upwardly. The counterbalancing mechanism may be coupled to the horizontally stationary member 107 and to the wafer carrier door receiver 103. For example, the counterbalancing (mechanism may comprise an extension 135 of the horizontally stationary member 107 that extends above the elevation of the wafer carrier door receiver 103, and a biasing mechanism 137 coupled between the extension 135 and the wafer carrier door receiver 103 as shown in FIGS. 3A–5. The biasing mechanism 137 may comprise a spring, a cylinder, a counterweight, or any mechanism that may bias the wafer carrier door receiver 103 upwardly so as to resist the gravitational force that otherwise may move the wafer carrier door receiver 103 vertically downward.

A vertical actuator such 139 is adapted to vertically move the inventive wafer carrier opener 101a upwardly, so as to place the wafer carrier door receiver 103 in position to engage the pod door 45. The actuator 139 also is adapted to vertically move the inventive wafer carrier opener 101a downward so as to expose an opening 35 (FIG. 1) in the interface wall 29, thereby allowing access to the wafers in the pod 43.

The operation of the inventive wafer carrier opener 101a is described with reference to the sequential views of FIGS. 3A–D, which show the movement of the inventive wafer carrier opener 101a. The upper link 111 and the lower link 113 are initially in a retracted (e.g. horizontal) position as shown in FIG. 3A.

In operation, the actuator 139, which is coupled to the horizontally stationary member 107, is energized and moves the horizontally stationary member 107 vertically upward, carrying the cam follower 123, and the wafer carrier door receiver 103 therewith. As the inventive wafer carrier opener 101a moves vertically upward, the horizontal extension 129 of the cam follower 123 contacts the cam 131 so as to prevent the cam follower 123 from further upward movement. The wafer carrier door receiver 103 also is prevented from moving vertically upward because the vertical extension 127 of the cam follower 123 is coupled to the wafer carrier door receiver 103, via the second joint 121 of the lower link 113. When the horizontal extension 129 of the cam follower 123 contacts the cam 131, the wafer carrier door receiver 103 is in position to engage (e.g. is at the same elevation as) the pod door 15, located on the wafer carrier platform 41.

The horizontally stationary member 107 and the counterbalancing mechanism continue to move vertically upward relative to the cam follower 123 and the wafer carrier door receiver 103, which remain at the elevation of the pod door 45. As the horizontally stationary member 107 moves vertically upward relative to the cam follower 123 and the wafer door receiver 103, the first joints 11, 119 of the upper link 111 and the lower link 113 move upward. As the member 107 is restrained horizontally, this vertical motion positions the upper link 111 and the lower link 113 in an extended position (e.g. a position that is more horizontal than is the retracted position) as shown in FIG. 3B, thereby extending the wafer carrier door receiver 103 horizontally.

As the upper link 111 and the lower link 113 move to the extended position, the cam follower 123 and the wafer carrier door receiver 103 move horizontally toward the interface wall 29 (e.g. the links 111, 113 leverage off of the horizontally stationary member 107). In the exemplary embodiment shown the wafer carrier door receiver 103 moves in a straight horizontal line, due to the horizontally straight configuration of the horizontal extension 29 and the vertical fixation thereof when engaged with cam 131. As the wafer carrier door receiver 103 moves horizontally toward the interface wall 29, the horizontally stationary member 107 and the extension 133 move vertically upward, the biasing mechanism 137 also biases the wafer carrier door receiver 103 upwardly (thus resisting the gravitational force that otherwise may move the wafer carrier door receiver 103 vertically downward and pulling the upper and lower links 111, 113 into the retracted position).

At the interface wall 29, the wafer carrier door receiver 103 of the inventive wafer carrier opener 101a couples to and unlatches the pod door 45, as is conventionally known.

Once the door 45 is opened, the actuator 139 reverses direction, and the horizontally stationary member 107 and the extension 133 (having the door attached thereto via the wafer carrier door receiver 103) begin moving vertically downward. As the horizontally stationary member 107 moves vertically downward, the first joints 115, 119 of the upper link 111 and the lower link 113 move downward. Because the position of first joints 115, 119 is horizontally fixed with respect to the wall 29 of the interface chamber 19, vertical motion of the joints 115, 119 enables the bar 129 to move to a position below the cam 131 in which the bar 129 no longer contacts the cam 131, thereby enabling biasing member 137 to retract and move the inner links 117, 121 upward and away from the pod 43 to retract the door 45 therefrom. Specifically, in this example, the biasing mechanism 137 is sufficiently stiff so as to continually upwardly bias the wafer carrier door receiver 103 (with or without the added weight of the door 45). Thus, when the bar 129 no longer contacts the cam 131 (which contact prevents the wafer carrier door receiver 103 from moving upward in response to the upward bias applied by the biasing mechanism 137), the biasing mechanism 137 causes the wafer carrier door receiver 103 to retract away from the pod 43, as described above.

As the upper link 111 and lower link 113 move to the retracted position, the cam follower 123 and the wafer carrier door receiver 103, with the pod door 45 attached thereto, move horizontally in a straight line (e.g., following the straight surface of the bar 129) away from the interface wall 29. The inventive wafer carrier opener 101a continues to move vertically downward so as to provide an opening in the interface wall 29, thereby allowing access to the wafers in the pod 43 as shown in FIG. 3D. Accordingly, as described above, the inventive wafer carrier opener 101a may move both vertically and horizontally with use of a single actuator.

FIGS. 5A–C are side views of a second embodiment 101b of the inventive wafer carrier opener. The inventive wafer carrier opener 101b may comprise the same components as the inventive wafer carrier opener 101a of FIGS. 3A–4. In this embodiment, however, the wafer carrier door receiver 103 has been configured to include a paddle 141, coupled to the horizontally stationary member 107, via the link 109.

The horizontally stationary member 107 is positioned on the wafer carrier side of the paddle 141 as shown in FIGS. 5A–C. Alternatively, as shown in FIG. 6, which is a perspective side view of the inventive wafer carrier opener 101b, the horizontally stationary member 107 may be positioned on the non-wafer carrier side of the paddle 141. Thus, the horizontally stationary member 107 may be positioned on either side of the paddle 141. Also, although the upper link 111 and the lower link 113 are positioned toward the bottom of the paddle 141 as shown in FIGS. 5A–C, the upper link 111 and the lower link 113 may be positioned at any location along the paddle 141.

The operation of the inventive wafer carrier opener 101b is substantially identical to that described above, and is now described with reference to the sequential views of FIGS. 5A–C, which show the movement of the inventive wafer carrier opener 101b. The upper link 111 and the lower link 113 are initially in the extended position as shown in FIG. 5A. Because the horizontally stationary member 107 is positioned on the wafer carrier side of the wafer carrier door receiver 103, the extended position pushes the wafer carrier door receiver 103 away from the wafer carrier 43, as shown in FIG. 5A; this is the only operational difference between the embodiment of FIGS. 3A–4 and that of FIGS. 5A–6.

In operation, with the use of the actuator 139, the inventive wafer carrier opener 101b moves vertically upward so as to place the wafer carrier door receiver 103 in position to engage the pod door 45. As the inventive wafer carrier opener 101b moves vertically upward, the horizontal extension 129 of the cam follower 123 contacts the cam 131 so as to prevent the cam follower 123 and the wafer carrier door receiver 103 from further moving vertically upward.

The horizontally stationary member 107 and the counterbalancing mechanism coupled thereto continue to move vertically upward relative to the cam follower 123 and the wafer carrier door receiver 103 which remain vertically stopped by the cam 131. As the horizontally stationary member 107 continues to move vertically upward, the first joints 115, 119 of the upper link 111 and the lower link 113 move upward therewith as the horizontally stationary member 107 is restrained horizontally, this vertical motion positions the upper link 111 and the lower link 113 in the retracted position as shown in FIG. 5B thereby extending the wafer carrier door receiver 103 horizontally. Because the horizontally stationary member 107 is positioned on the wafer carrier side of the wafer carrier door receiver 103, the retracted position thus pulls the wafer carrier door receiver 103 toward the wafer carrier 43.

As the upper link 111 and the lower link 113 move to the retracted position, the cam follower 123 and the wafer carrier door receiver 103 coupled thereto move horizontally in a straight line (e.g., due to the horizontally straight configuration of the horizontal extension 129 and the vertical fixation thereof when engaged with the cam 131) toward the interface wall 29 (FIG. 2) as shown in FIG. 5B. As the wafer carrier door receiver 103 moves horizontally toward the interface wall 29, and as the counterbalancing mechanism moves vertically upward, the biasing mechanism 137 of the counterbalancing mechanism also biases the wafer carrier door receiver 103 upwardly (thus resisting the gravitational force that otherwise may move the wafer carrier door receiver 103 vertically downward and pulling the upper and lower links 111, 113 into the retracted position).

At the interface wall 29, the wafer carrier door receiver 103 of the inventive wafer carrier opener 101b couples to and unlatches the pod door 45, as is conventionally known. Once the pod door 45 is opened, the inventive wafer carrier opener 101b (having the pod door 45 attached thereto via the wafer carrier door receiver 103) moves vertically downward so as to provide an opening in the interface wall 29, thereby allowing access to the wafers in the pod 43 as shown in FIG. 5C.

As is evident from the description above, the inventive wafer carrier opener 101a, 101b may use a single actuator 139, which may result in increased equipment reliability, and reduced cost per unit wafer processed.

Further, the cam 131 provides a convenient datum point that allows the position of the wafer carrier door receiver 103 to be accurately controlled relative to the pod door 45. Additionally, the preferred straight-line motion (e.g., which may result from the cam 131 following the straight surface of the bar 129) of the wafer carrier door receiver 103 may reduce particle generation that may otherwise occur when the wafer carrier door 103 contacts the pod door 45. However, a wafer carrier door receiver may move along an alternative path (e.g. along an arch path) toward the interface wall 29.

The foregoing description discloses only the preferred embodiments of the invention, modifications of the above-disclosed apparatus and method which fall within the scope of the invention will be readily apparent to those of ordinary skill in the art. For example, the cam follower 123 may be coupled to the second joints 117, 121 of both the upper link 111 and the lower link 113. The links 111, 113 may be similarly employed to translate horizontal actuation of a vertically stationary mechanism into vertical motion of a wafer carrier door receiver. In fact, the links 111, 113 may be employed to translate motion of a first direction into motion of a second direction, (in this example, perpendicular to the first direction). Thus, actuation need not be purely horizontal or purely vertical. Likewise, the horizontally (or vertically) stationary member may move horizontally (or vertically) so long as the member provides a repeatable horizontal (or vertical) position against which the links 111, 113 may leverage.

Accordingly, while the present invention has been disclosed in connection with the preferred embodiments thereof, it should be understood that there may be other embodiments which fall within the spirit and scope of the invention, as defined by the following claims.

What is claimed is:

1. A wafer carrier opener comprising:
   a wafer carrier door receiver adapted to receive a wafer carrier door;
   a horizontally stationary member adapted to move vertically; and
   a link coupled between the wafer carrier door receiver and the horizontally stationary member so as to allow horizontal movement of the water carrier door receiver;
   wherein the link comprises a pair of links coupled between the wafer carrier door receiver and the horizontally stationary member such that the wafer carrier door receiver, the horizontally stationary member, and the pair of links form a four-bar link.

2. The wafer carrier opener of claim 1 further comprising a counterbalance coupled to the horizontally stationary member and to the wafer carrier door receiver, the counterbalance adapted to bias the wafer carrier door receiver upwardly.

3. The wafer carrier opener of claim 2 wherein the counterbalance comprises a spring.

4. A system adapted to receive a sealed wafer carrier and to open the sealed wafer carrier, the system comprising:
   the wafer carrier opener of claim 1; and
   a wafer carrier platform, adapted to receive a sealed wafer carrier, operatively coupled to the wafer carrier opener.

5. A system adapted to process a wafer comprising:
   a wafer carrier loading station having the wafer carrier opener of claim 1; and
   a processing tool, coupled to the wafer carrier loading station, having at least one processing chamber.

6. A wafer carrier opener comprising:
   a wafer carrier door receiver adapted to receive a wafer carrier door;
   a horizontally stationary member adapted to move vertically;
   a link coupled between the wafer carrier door receiver and the horizontally stationary member so as to allow horizontal movement of the wafer carrier door receiver; and
   a counterbalance coupled to the horizontally stationary member and to the wafer carrier door receiver, the counterbalance adapted to bias the wafer carrier door receiver upwardly.

7. The wafer carrier opener of claim 6 further comprising a vertical motion stop and a mechanism coupled to the horizontally stationary member so as to move vertically therewith, and coupled to the wafer carrier door receiver so as to move horizontally therewith, the mechanism adapted so as to contact the vertical motion stop and to thereby be stopped from further vertical motion.

8. The wafer carrier opener of claim 7 wherein the counterbalance comprises a spring.

9. A wafer carrier opener comprising:
- a wafer carrier door receiver adapted to receive a wafer carrier door;
- a horizontally stationary member adapted to move vertically;
- a link coupled between the wafer carrier door receiver and the horizontally stationary member so as to allow horizontal movement of the wafer carrier door receiver; and
- a vertical motion stop and a mechanism coupled to the horizontally stationary member so as to move vertically therewith, and coupled to the wafer carrier door receiver so as to move horizontally therewith, the mechanism adapted so as to contact the vertical motion stop and to thereby be stopped from further vertical motion.

10. The wafer carrier opener of claim 9 wherein the link comprises a pair of links coupled between the wafer carrier door receiver and the horizontally stationary member such that the wafer carrier door receiver, the horizontally stationary member, and the pair of links form a four-bar link.

* * * * *